United States Patent
Katti

(10) Patent No.: US 7,746,686 B2
(45) Date of Patent: Jun. 29, 2010

(54) PARTITIONED RANDOM ACCESS AND READ ONLY MEMORY

(75) Inventor: Romney R. Katti, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 352 days.

(21) Appl. No.: 11/409,371

(22) Filed: Apr. 21, 2006

(65) Prior Publication Data

US 2007/0247897 A1 Oct. 25, 2007

(51) Int. Cl.
*G11C 11/00* (2006.01)
*G11C 8/00* (2006.01)

(52) U.S. Cl. ............... 365/158; 365/230.06

(58) Field of Classification Search ........ 365/158, 365/185.23, 230.06, 94, 171, 173
See application file for complete search history.

(56) References Cited

U.S. PATENT DOCUMENTS

| | | | |
|---|---|---|---|
| 5,756,366 A | 5/1998 | Berg | |
| 5,818,771 A * | 10/1998 | Yasu et al. | 365/195 |
| 5,959,906 A * | 9/1999 | Song et al. | 365/200 |
| 6,147,922 A | 11/2000 | Hurst | |
| 6,175,525 B1 | 1/2001 | Fulkerson | |
| 6,178,111 B1 | 1/2001 | Sather | |
| 6,455,177 B1 | 9/2002 | Everitt | |
| 6,469,928 B2 * | 10/2002 | Takata | 365/185.04 |
| 6,493,258 B1 | 12/2002 | Lu | |
| 6,842,365 B1 | 1/2005 | Nahas et al. | 365/158 |
| 6,975,547 B2 * | 12/2005 | Byeon et al. | 365/195 |
| 7,362,644 B2 * | 4/2008 | Yang et al. | 365/225.5 |
| 2001/0015933 A1 * | 8/2001 | Reddy et al. | 365/230.05 |
| 2001/0038554 A1 * | 11/2001 | Takata et al. | 365/185.09 |
| 2004/0001352 A1 * | 1/2004 | Nahas et al. | 365/158 |
| 2005/0013162 A1 * | 1/2005 | Jeon et al. | 365/185.01 |
| 2005/0052901 A1 | 3/2005 | Nahas et al. | 365/158 |
| 2005/0152179 A1 | 7/2005 | Katti | 365/157 |

OTHER PUBLICATIONS

International Search Report for PCT/US2007/001293 dated Apr. 11, 2008.
Hong et al., "Magnetic element Shape for Magnetic Random Access Memory (MRAM)", (May 28-29, 2003) (http://www.cambr.uidaho.edu/symposiums/symp11.asp).
Daughton, "Magnetoresistive Random Access Memory (MRAM)," pp. 1-13 (Feb. 4, 2000).
Hertel, "Thickness Dependence of Magnetization Structures in Thin Permalloy Rectangles", Max-Planck-Institut fur Mikrostrukturphysik, Weinberg 2, 06120 Halle, Germany, Oct. 2002.
Slaughter, "Magnetic Tunnel Junction Materials for Electronic Applications,"JOM (Jun. 2000). (www.tms.org/pubs/journals/JOM/0006/Slaughter/Slaughter-0006.html).
"HXNV0100 64K ×16 Non-Volatile Magnetic RAM," Honeywell International Inc., Aerospace Electronics Systems, (www.honeywell.com), pp. 1-14., May 2005.
U.S. Appl. No. 11/446,547, filed Jun. 2, 2006, Romney R. Katti.
U.S. Appl. No. 11/376,433, filed Mar. 15, 2006, Romney R. Katti.
U.S. Appl. No. 11/440,966, filed May 25, 2006, Daniel S. Reed.

* cited by examiner

*Primary Examiner*—VanThu Nguyen
*Assistant Examiner*—Douglas King
(74) *Attorney, Agent, or Firm*—Shumaker & Sieffert, P.A.

(57) ABSTRACT

A magnetic memory and a method of operating the memory are described. The memory includes memory cells that may each include a magnetoresistive bit. The memory cells may each be coupled to a current driver. Each current driver may be inhibited so that it does not output a current. Inhibiting the output current prevents the memory from being written. By inhibiting some current drivers and not inhibiting other current drivers, the memory may be partitioned into read only and random access portions.

20 Claims, 9 Drawing Sheets

PARTITIONED RANDOM ACCESS AND READ ONLY MEMORY

GOVERNMENT RIGHTS

The United States Government has acquired certain rights in this invention pursuant to Contract No. DTRA01-00-C-0002 awarded by the Defense Threat Reduction Agency (DTRA).

FIELD

The invention relates to nonvolatile memories and more particularly to a magnetic memory that is partitioned into a magnetic random access memory (MRAM) and a magnetic read only memory (MROM).

BACKGROUND

The discovery of the giant magnetoresistive (GMR) effect has led to the development of a number of spin-based electronic devices. The GMR effect is observed in certain thin-film devices that are made up of alternating ferromagnetic and nonmagnetic layers. In a typical device, the relative orientations of magnetic directions of the ferromagnetic layers define a binary state of the device. The resistance across a device is generally lowest when the magnetic directions of the ferromagnetic layers are in a parallel orientation and highest when the magnetic directions are in an antiparallel orientation.

One type of GMR device is commonly referred to as a "spin valve." GMR devices, including spin valves, can be used as data storage elements in magnetic random access memory (MRAM) devices. In this regard, exemplary MRAM applications of GMR devices are described in U.S. Pat. Nos. 6,147,922; 6,175,525; 6,178,111; 6,493,258, and U.S. Pat. App. Pub. No. 2005/0226064, all of which are incorporated herein by reference.

A spin valve typically includes two or more ferromagnetic layers that are separated by a thin layer of a non-magnetic metal (often copper) and also includes an antiferromagnetic layer that "pins" the magnetization direction of one of the ferromagnetic layers. FIG. 1A illustrates (in a simplified form) the layers in a typical spin valve 10 as seen from a side view. As shown in FIG. 1A, the spin valve 10 includes ferromagnetic layers 12 and 14 separated by a nonmagnetic layer 16. In a typical arrangement, one of the magnetic layers is configured to be a fixed layer 14. The fixed layer 14 is adjacent to an anti-ferromagnetic layer 18, such that the magnetization direction of the fixed layer 14 is "pinned" in a particular orientation. The arrow in the fixed layer 14 indicates an exemplary pinned orientation, though, in general, the orientation could be pinned in either direction. Thus, the magnetization direction of the fixed layer 14 remains relatively fixed when operational magnetic fields are applied to spin valve 10. A second magnetic layer 12 is termed a free layer 12. In contrast with the fixed layer 14, the magnetization direction of the free layer 12 is free to switch between parallel and antiparallel orientations, as indicated by the double-arrow symbol in the free layer 12. By applying an appropriate magnetic field to the spin valve 10, the magnetization direction of the free layer 12 can be inverted while the magnetization direction of the fixed layer 14 remains the same.

FIG. 1B shows a three-dimensional view of the spin valve 10 of FIG. 1A. As shown, the spin valve 10 has a hard-axis (short-axis) and an easy-axis (long-axis). In the absence of an applied magnetic field, the magnetization directions of both the free layer 12 and the fixed layer 14 run substantially parallel to the easy-axis.

Typically, an MRAM comprises memory cells that include at least one GMR, or magnetoresistive, based device. In many instances, memory cells that contain magnetoresistive based devices are laid out in a similar fashion to conventional, more volatile, memories such as static random access memories (SRAMs) or dynamic random access memories (DRAMs), for example. Because magnetoresistive based devices have a high degree of non-volatility, MRAMs, in comparison to SRAMs or DRAMSs, may provide an increased measure of protection from losing a data state. For instance, magnetoresistive based devices do not store a charge, so there is a decreased likelihood of misappropriated charge or charge dissipation causing an upset of a memory.

Although magnetoresistive based devices are inherently non-volatile, MRAMs, and other magnetic based memories still use volatile-charge-storage-based circuit elements (e.g., field effect transistors) to control at least some functionality. It is desirable therefore, to provide an increased measure of protection from volatility in a magnetic memory.

SUMMARY

A magnetic memory and a method of operating the memory are presented. The memory includes a memory cell that comprises a magnetoresistive memory bit, which may be, for instance, a magnetic tunneling junction device. In one example, the memory cell is coupled to a current driver, which outputs a current that may be used to generate a magnetic field within the memory cell, and thus write the memory cell. However, when the current driver is inhibited (by an inhibit signal, for example), the current driver is prevented from outputting a current. As a consequence, the current driver cannot write the memory cell until it is uninhibited. Advantageously, inhibiting and uninhibiting current drivers within the memory allows the memory to be selectively partitioned out, so that a portion of the memory operates in a read only mode.

In another example, the memory may include a second memory cell that is coupled to a second current driver. The second current driver may also be inhibited or uninhibited. Both the first and the second memory cells may be located on the same chip and thus allow the memory to contain both read only and random access memory cells. The first current driver, for example, may be inhibited so that the first memory cell is in a read only mode, and the second current driver may not be inhibited so that the second memory cell is in a random access mode. In an additional example, the memory may include write logic that selects an appropriate operating mode of either the first and/or second memory cell. In general, the operating modes include, but are not limited to, a read only mode, a programmable read only mode, and a random access mode.

In another example, a memory includes a plurality of memory cells. The memory may be partitioned into first and second portions. The first portion of the plurality of memory cells operate in a random access mode and the second portion of the plurality of memory cells operate in a read only mode. Each memory cell may be coupled to one or more current drivers. Each current driver may include an input for receiving an inhibit signal.

In another example, the second portion of the memory may be programmed by a process that includes not inhibiting at least one current driver of each memory cell within the second portion; using the current driver to write the memory cells within the second portion; and re-inhibiting the current driver. The programming process may allow memory cells to be written on a limited basis, which may allow such memory cells to be protected from an inadvertent write. In addition, write inhibit logic may be useful in determining an appropriate partitioning.

In an additional example, each memory cell within the memory may be coupled to a row current driver and a column current driver. A selected memory cell may be in a read only mode when both of the selected memory cell's associated column and row current drivers are disabled. In such an example, the selected memory cell may only be in a read only mode when the selected memory cell's associated row and column current drivers are inhibited. In a further example, the write inhibit logic may comprise a multiplexer that includes a multi-bit input, a column select output, and a row select output. The multi-bit input may determine a size of the first and the second partitions.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

DETAILED DESCRIPTION OF THE DRAWINGS a) Memory Cell Architecture

Figure 1A:
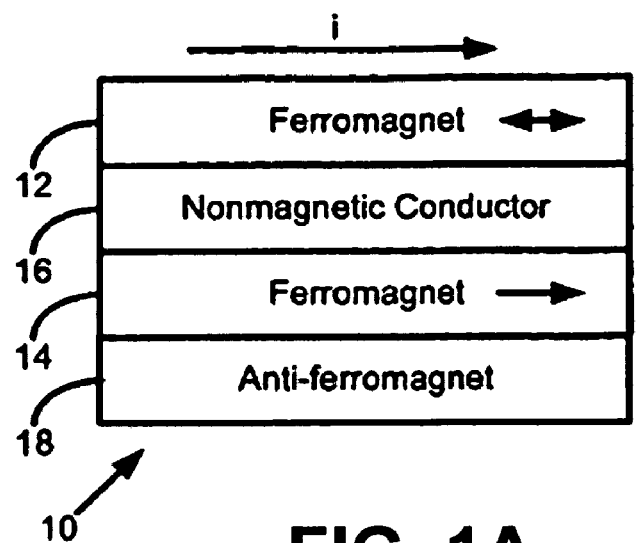
FIG. 1A is a schematic diagram of the layers of a prior art spin valve.
Figure 1B:
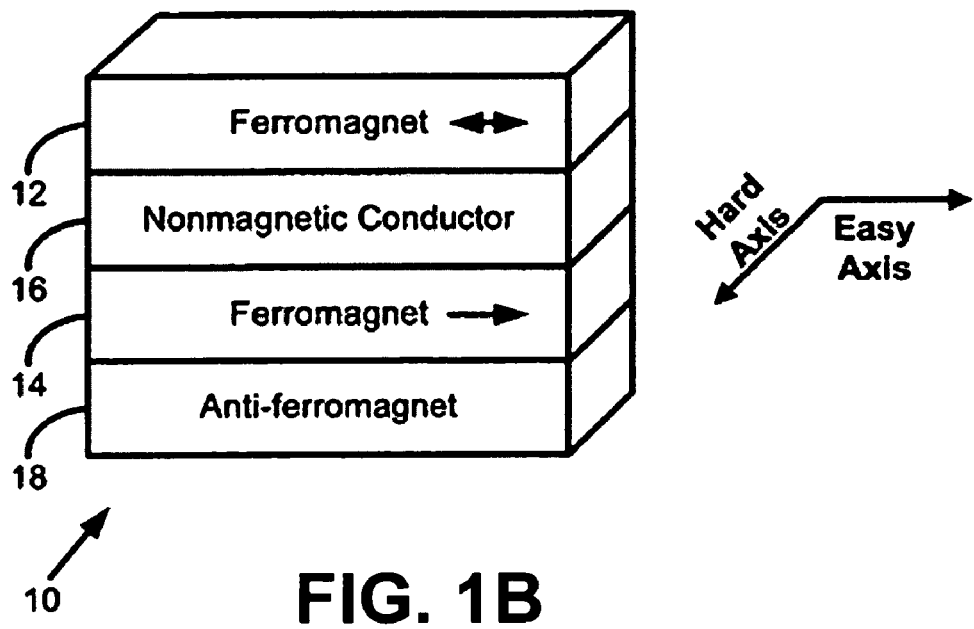
FIG. 1B is a three dimensional view of a prior art spin valve.
Figure 2:
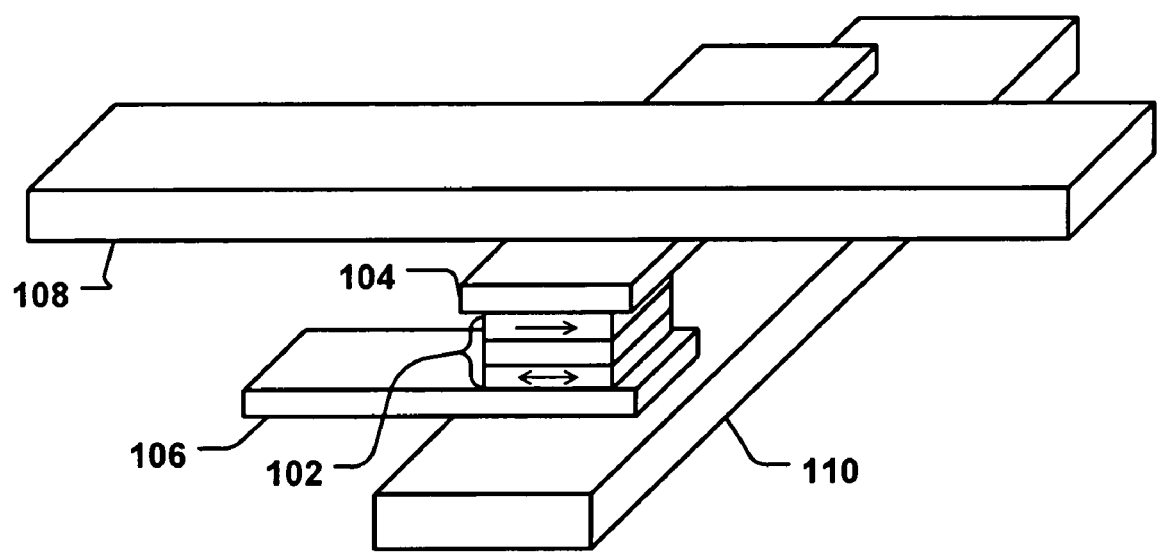
FIG. 2 is a three dimensional view of a spin valve showing conducting lines for reading and writing.

Referring to the drawings, FIG. 2 generally depicts a magnetic memory cell with separate read and write architecture. A magnetoresistive memory bit 102 is shown as a tri-layer element having a spacer layer sandwiched between two conducting magnetic layers. Each magnetic layer of the bit 102 has a magnetization direction. In FIG. 2, the top magnetic layer is shown with a single headed arrow indicating that the magnetization direction of the top magnetic layer does not change during operation of the cell. Thus, the top magnetic layer is known as the reference, or pinned layer. The bottom magnetic layer is shown with a double headed arrow indicating that the magnetization direction of the bottom magnetic layer can be inverted during operation of the cell. Thus, the bottom magnetic layer is known as the storage, or free layer. As one skilled in the art will recognize, the orientation of the layers can be altered without eliminating the usefulness of the bit 102.

A first read line 104 is coupled to a first side of the bit 102 and a second read line 106 is coupled to a second side of the bit 102. The two read lines are arranged such that a voltage difference between the first read line 104 and the second read line 106 will generate a current flowing through the layers of the bit 102. The first read line 104 may run perpendicular to the second read line 106. However, as one skilled in the art will understand, this arrangement is not necessary. For example, in alternative examples, the second read line 106 does not run perpendicular to first read line 104, but rather terminates at a ground after passing through a select transistor.

A first write line 108 is shown above the first read line 104. The first write line 108 is separated from the first read line 104 and from the rest of the cell by a first insulative spacer (not shown). The first write line 108 is arranged near the bit 102 such that a current passing through the first write line 108 creates a magnetic field that acts on the bit 102.

A second write line 110 is shown below the second read line 106. The second write line 110 is separated from the second read line 106 and from the rest of the cell by a second insulative spacer (not shown). The second write line 110 is arranged near the bit 102 such that a current passing through the second write line 110 creates a magnetic field that acts on the bit. The first write line 108 is generally arranged to run perpendicular to the second write line 110. However, as one skilled in the art will understand, this arrangement is not necessary.

A logical state of the cell depends upon the relative orientation of the magnetization directions of the magnetic layers of the bit 102. Thus, the logical state of the cell is set by orientating the magnetization layers. A first current passing through the first write line 108 and a second current passing through the second write line 110 create a combined magnetic field. The combined magnetic field acts on the bit 102 to invert the orientation of the magnetization direction of the free layer of the bit 102.

To determine the logical state of the bit 102, a voltage difference is created between the first read line 104 and the second read line 106. The voltage difference results in a tunneling current passing perpendicularly through the layers of the bit 102. The value of the tunneling current is indicative of the logical state of the bit 102. The arrangement shown in FIG. 2 may be most applicable to a bit with a high top to bottom resistivity such as a magnetic tunnel injunction (MTJ). In an additional example, such as where the spacer layer is a conductive layer, the read lines may be coupled with the bit ends so that the read current flows along the easy axis of the bit. A ground current (in lieu of a tunneling current) may run through the conductive layer. This ground current may terminate at a ground after passing through a select transistor, as described above. In this case, the value of the ground current is indicative of the logical state of the bit.

b) Magnetic Switching Process

Figure 3:
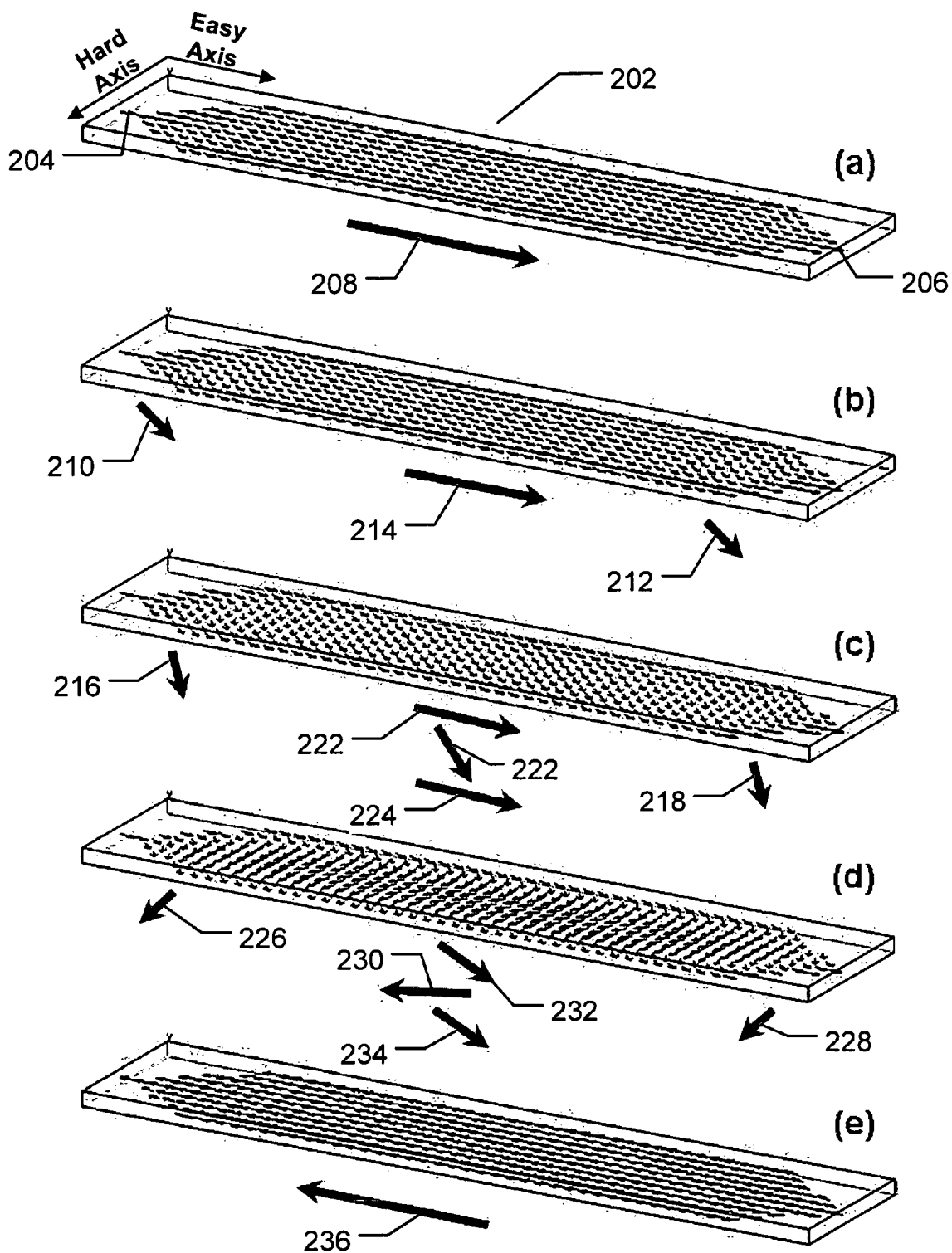
FIG. 3 is a sequential diagram of a magnetic switching process in a magnetic layer.

In a magnetoresistive bit with a pair of magnetic layers, a logical state of the bit is determinable from the magnetization directions of the magnetic layers. The logical state may be switched from a first state to a second state by switching (or inverting) the magnetization direction of one of the magnetic layers. Referring to FIG. 3, a series of frames chronicle a finite analysis of a magnetic switching process in a magnetic layer of a magnetoresistive bit in a prophetic example. In general, the series shows that the switching process involves a coordinated rotation (or reversal) of elemental magnetization directions within the magnetic layer.

Looking first at Frame (a), a magnetic layer 202 is shown as an elongated element with tapered bit ends. For convenience, the bit ends are labeled a first bit end 204 and a second bit end 206. An easy-axis (long-axis) of the magnetic layer 202 is shown running parallel to the elongation of the magnetic layer

202. A hard-axis (short-axis) is aligned in the plane of the magnetic layer 202 and runs perpendicular to the easy-axis. Within magnetic layer 202, elemental magnetization directions are shown as small arrows pointing along the easy-axis toward the second bit end 206. Magnetic exchange between the bit ends and the body of the bit would tend to make the magnetization uniform and unidirectional. (Magnetization exchange is the ferromagnetic exchange that tends to magnetize a magnetic domain of an ensemble of atoms in a given direction.)

A summary arrow 208 shows a composite magnetization direction of the magnetic layer 202 pointing along the easy-axis toward the second bit end 206. The uniform magnetization along the easy-axis as shown in Frame (a) is indicative of a first logical state.

Frames (b), (c), (d), and (e) represent the magnetic layer 202 in sequential scenes of a switching process. Thus, in parallel fashion, the first bit end 204 is the leftmost end of the magnetic layer in each frame, and the second bit end 206 is the rightmost end of the magnetic layer in each frame.

Jumping to Frame (e), the final frame, elemental magnetization directions are shown pointing along the easy-axis toward the first bit end 204. Frame (e) summary arrow 236 shows a generalized magnetization direction pointing in the opposite direction of the Frame (a) summary arrow 208. The uniform magnetization along the easy-axis as shown in Frame (e) is indicative of a second logical state. Thus, the objective of a switching process is to switch the logical state of the magnetization layer 202 from the first logical state to the second logical state. Frames (b), (c), and (d) give further detail of the switching process.

In Frame (b), the elemental magnetization directions as shown by small arrows in the magnetic layer are no longer uniform across the entire magnetic layer. Specifically, elemental magnetization directions at the bit ends have begun to rotate clockwise toward the hard-axis. However, elemental magnetization directions in the elongated portion of the magnetic layer continue to point toward the second bit end 206. Frame (b) summary arrows 210, 212, and 214 mirror the elemental magnetization. In Frame (b), it can be seen that the switching process is initiated in the bit ends 204 and 206.

In Frame (c), the elemental magnetization directions show further rotation. Frame (c) summary arrows 216-224 mirror the rotation of the elemental magnetization directions. The bit end summary arrows 216 and 218 indicate further rotation of elemental magnetization directions at the bit ends 204 and 206. A center of the elongated portion of the magnetic layer has begun to rotate clockwise as shown by the center summary arrow 220. The edge summary arrows 222 and 224 show little rotation and indicate that elemental magnetization directions along edges of the elongated portion continue to substantial point toward the second bit end 206.

In Frame (d), bit end summary arrows 226 and 228 indicate continued rotation of elemental magnetization directions in the bit ends 204 and 206. The center of the elongated portion continues to rotate as shown by summary arrow 230. Edge summary arrows 232 and 234 indicate that elemental magnetization directions along the edges has begun to rotate in earnest.

Finally, Frame (e) shows a completed rotation and reformation of the uniformity of elemental magnetization directions across the magnetic layer. FIG. 3 in general shows how switching of the magnetization direction of the magnetic layer is initiated in the bit ends, continues through the center of the layer, and completes with reversal of the edges.

Although each intermediate frame (b), (c), (d) include elemental magnetization directions in several different directions, composite magnetization directions can be calculated through, for instance, an elemental average. In an alternative example, the composite magnetization directions for the frames are shown by the center summary arrows 214, 220, and 230.

As will be understood by one skilled in the art, the first and second logical states may be arbitrarily selected. Thus switching the magnetic layer from the second logical state to the first logical state involves a mirror-image procedure as switching from the first logical state to the second logical state. FIG. 3 is intended to serve as an example of a switching process and should not be seen as limiting. In addition, it should be understood that a variety of GMR based spin valves, or other type of magnetoresistive memory bits, may be used in the memory described below.

c) Partitioned Magnetic Memory

A magnetic memory may include a plurality of memory cells arranged in column arrays and row arrays. Alternative configurations, that do not include a column and row configuration, may also be used. Each memory cell within the memory includes a magnetoresistive-based memory bit (e.g., a GMR bases spin valve, a MTJ device, etc.).

In a column and row configuration, the column and row arrays include conductive data lines that may each carry a current. The data lines are used to write and/or read memory cells. To write a memory cell, a current in a data line generates a magnetic field that is proximal to a memory cell's bit. To read a memory cell, a current in a data line passes through a memory cell's bit and a resistance is sensed, which, as described above, may be performed in a variety of ways. Typically, one of the column or row arrays will include data lines that run underneath memory cells. The other array will include data lines that run above the memory cells.

In general, at least two data lines are used to write a memory cell: a data line above the memory cell and a data line below the memory cell. Both data lines together create an aggregated magnetic field that may cause a bit within the memory cell to flip to either a parallel state or an antiparallel state. Two data lines are generally preferred in order to prevent an inadvertent write to a neighboring memory cell. However, a memory may use more or fewer data lines to write to a memory cell. Memories that do not have a column and row configuration, for example, may use only one data line per memory cell.

To read a memory cell, the same data lines used for a write may be employed, or separate data lines may provide access to a memory cell. The implementation of the architecture may depend on the type of bit that a memory cell includes. It should be understood, therefore, that a variety of architectures are possible.

Figure 4:
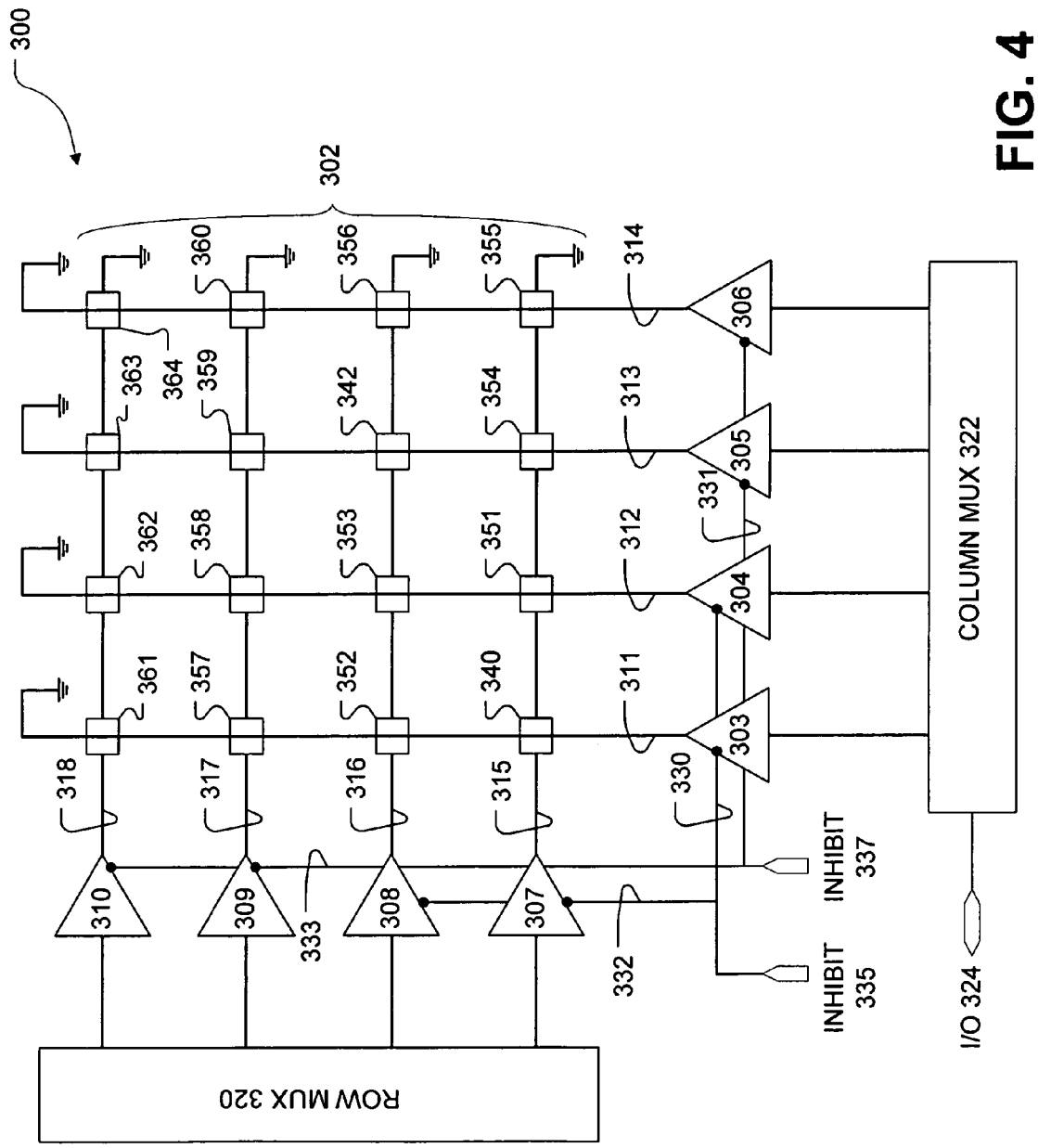
FIG. 4 is a block diagram of a memory comprising memory cells that may be partitioned.

FIG. 4 shows a magnetic memory 300 that includes a plurality of memory cells 302 coupled to a plurality of current drivers 303-310. Each memory cell within the memory cells 302 includes at least one magnetoresistive memory bit. A read architecture may be integrated into the configuration of FIG. 4 or a separate read architecture may be used to read any one of the memory cells 302. Although the description below is primarily directed to writing the memory 300, it should be understood that the memory 300 and similar implementations are not limited by the type of read architecture employed.

To write the memory 300, the current drivers 303-310 communicate a current to a memory cell selected from the memory cells 302. The current drivers 303-306 are column current drivers and the current drivers 307-310 are row current drivers. Data lines 311-314, which may also be referred to as bit lines, couple the current drivers 303 306 to the memory cells 302. Data lines 315-318, which may be referred to as word lines, couple the current drivers 307-310 to the memory cells 302. The current drivers 307-310 are coupled to a row multiplexer 320, which selects a row that contains a memory cell that is to be written (or read). The current drivers 303-306, on the other hand, are coupled to a column multiplexer 322, which selects a column that contains the memory cell that is to be written (or read). The column mux 322 may include a data port 324 for either inputting data to be written (or outputting data to be read). Additionally, the memory 300 may also include enable circuitry (not shown), which directs the memory 300 to perform a write (or a read).

Each of the current drivers 303-310 includes an input, referred to as an operational mode input. The mode input of each of the current drivers 303-310 may be coupled to a signal line that is capable of communicating a signal indicative of whether or not a current driver should or should not output a current. In this disclosure, the signal is referred to as an inhibit signal. In one example, the inhibit signal may be a digital, binary signal. Upon receiving the inhibit signal, a current driver should not output a current, even if the enable circuitry directs the memory 300 to perform a write. Other types of signaling, may also inhibit a current driver.

In general, the current drivers 303-310 may each be configured in a variety of ways. For example, the current driver 303 may include a current mirror, and first and second transistors (not shown). The current mirror may be coupled to the data line 311. The first transistor may be coupled to the mode input of the current driver 303 and the second transistor may be coupled to a terminal (not shown) of the column mux 322. When both the first and the second transistors are enabled, the current mirror may output a current to the data line 311. However, when an inhibit signal is communicated to the mode input of the current driver 303, the current mirror may become disabled, thus inhibiting the current mirror from outputting the current. Consequently, the current mirror, and therefore, the current driver are inhibited. Even if the current driver 303 is directed to output a current by the enable circuitry, for example, the current driver 303 should not output a current. The current drivers 304-310 may have a similar structure to that of the current driver 303. Moreover, the current drivers 303-310 are not limited to a particular structure; a variety of different types of current drivers may be used.

To communicate the inhibit signal, the mode inputs of the current drivers 303 and 304 are coupled to an inhibit line 330; the mode inputs of the current drivers 305 and 306 are coupled to an inhibit line 331; the mode inputs of the current drivers 307 and 308 are coupled to an inhibit line 332; and the mode inputs of the current drivers 309 and 310 are coupled to an inhibit line 333. The inhibit lines 330 and 332 are coupled to an inhibit input 335 and the inhibit lines 331 and 333 are coupled to an inhibit input 337.

When the inhibit signal is communicate to either of the inhibit inputs 335 and 337, any one of the current drivers 303-310 may be selectively disabled. For example, the inhibit 335 may be used to inhibit the current drivers 303 and 307, which are coupled via the data lines 311 and 315 to a memory cell 340. When both the current drivers 303 and 307 are inhibited, the memory cell 340 is inhibited from being written to (other memory cells may also be inhibited). Typically, the currents that the data lines 311 and 315 carry should each be at or above a predetermined threshold. The predetermined threshold is a current level that will insure that a sufficient magnetic field will be generated, where the magnetic field is capable of inducing a bit flip in the memory cell 340. In an alternative example, however, the memory cell 340 may only use a single data line for writing and/or reading. In such an example, the implementations described below may be modified so that a memory cell is in a read only mode when the memory cell's associated current driver is inhibited and in a random access mode when the associated current driver is not inhibited.

In the example of FIG. 4, when the current drivers 303 and 307 are inhibited, the memory cell 340 is in a read only mode. Other memory cells within the memory 300, however, may be in a different operational mode. For example, a memory cell 342, which is coupled to the current drivers 305 and 309, may be in a random access mode. In the example of FIG. 4, the memory cell 342 may be in the random access mode when at least one the current drivers 305 and 309 are uninhibited.

Inhibiting and uninhibiting the current drivers 303-310 provides a measure of non-volatility to the memory 300. Because the current drivers 303-311 may include charge storage based circuit elements, the current drivers 303-311, along with other volatile upstream and downstream circuit elements, may be vulnerable to erroneous state changes. State changes may be induced by a radiation event, such as a particle strike or other type of soft error phenomena, for example.

Therefore, in some examples, it may be preferable to inhibit all of the current drivers until a write it to be carried out on a particular memory cell within the memory 300. For example, even though the memory cell 342 may be in a random access mode, the current drivers 305 and 309 may remain inhibited until the write is to be carried out. However, because the memory cell 340 is in a read only mode, the current drivers 303 and 307 may remain inhibited even if a write is attempted. The memory cell 340 may, for example, be written on limited basis, such as when the memory 300 is initially configured. For example, the memory cell 340 may be programmed by not inhibiting the current drivers 303 and 307. The current drivers 303 and 307 may then be used to write the memory cell 340. After the write, the current drivers 303 and 307 may be re-inhibited. Thus, the memory cell 340 may be operated in a programmable read only mode.

Advantageously, inhibiting and uninhibiting the current drivers 303-310 allows the memory 300 to be selectively partitioned out, so that a portion of the memory 300 operates in a read only mode, or programmable read only mode, and another portion of the memory 300 operates in a random access mode. For example, if the inhibit input 335 receives the inhibit signal and the inhibit input 337 does not receive the inhibit signal, the memory cell 340 along with memory cells 350-352 may be operated in a read only mode. The memory cell 342, along with memory cells 353-364, on the other hand, may be operated in a random access mode.

d) Partitioning Circuitry and Write Logic

In order to partition out read only and random access portions of a memory, the memory may include a variety of circuitry for facilitating the partitioning. For example, circuitry may be coupled to data lines, or mode inputs of current drivers. In addition, data lines may be dedicated to particular memory cells within the memory and additional current drivers may be included. Alternatively, write inhibit logic may provide a degree of customization of the memory. The write inhibit logic, for example, may receive an input that is indicative of which memory cells within the memory are to be partitioned as read only or random access. The write inhibit logic may output the inhibit signal to the appropriate current drivers within the memory.

Figure 5:
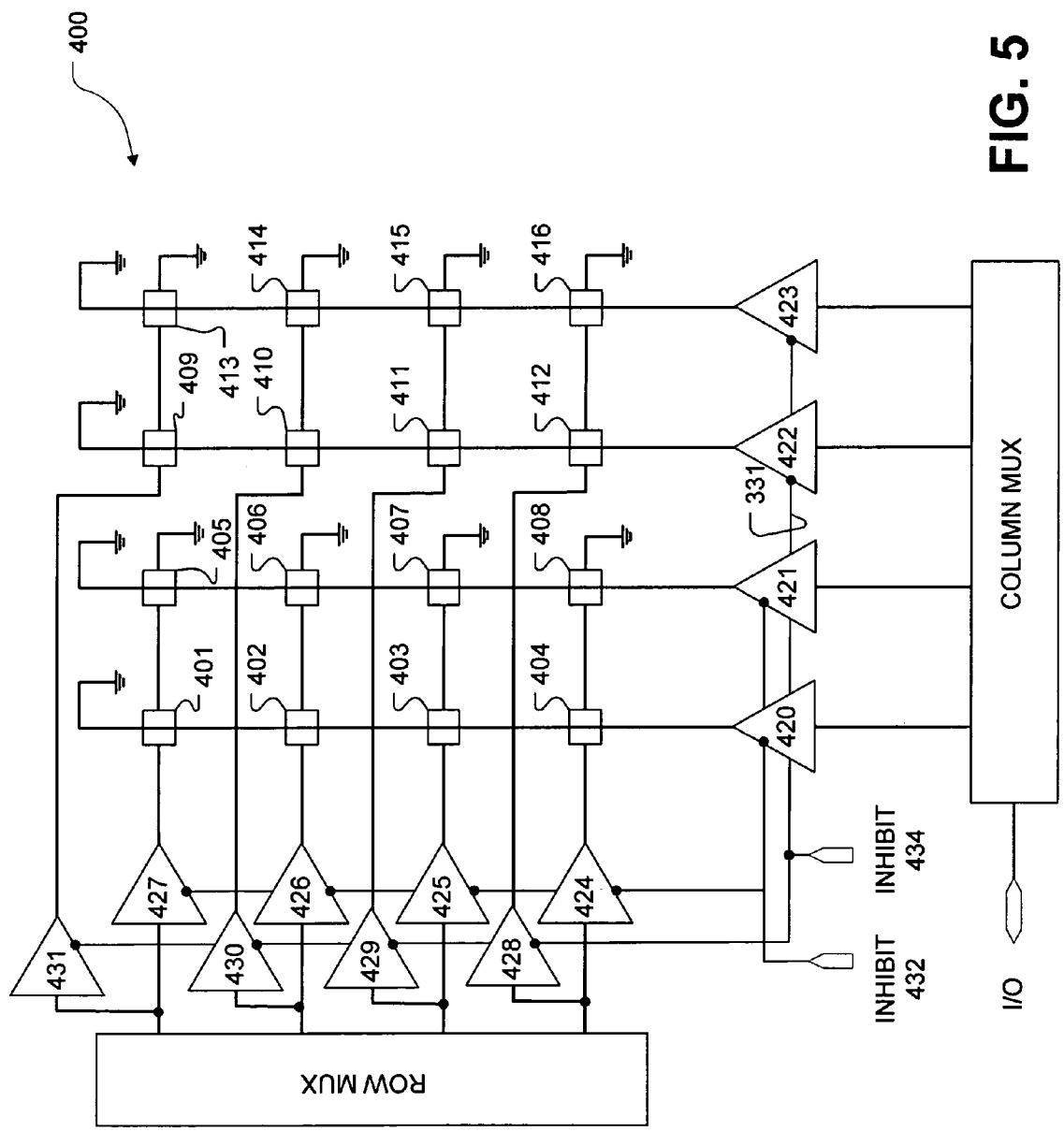
FIG. 5 is another block diagram of a memory comprising memory cells that may be partitioned.

As an example of partitioning circuitry, FIG. 5 shows a magnetic memory 400 that uses two sets of current drivers in a row array. In a column array, the memory 400 includes memory cells 401-416 coupled to current drivers 420-423. In a first portion of the row array, the memory cells 401-408 are coupled to current drivers 424-427. In a second portion of the row array, the memory cells 409-416 are coupled to the current drivers 428-431. The current drivers 420, 421, and 424-427 are coupled to an inhibit input 432. The current drivers 422, 423, and 428-431 are coupled to an inhibit input 434. In the configuration of FIG. 5, the memory 400 is separated into two partitions, where the inhibit input 432 is for receiving a signal that inhibits the memory cells 401-408 and the inhibit input 434 is for receiving a signal that inhibits the memory cells 409-416. Operationally, the memory 400 ensures that a random access partition uses current from overlapping data lines during a write. The memory 400 also ensures that a read only partition inhibits each current driver associated with the read only partition.

A variety of other partitioning configurations and circuitry are possible. Partitioning circuitry may also include various logic gates, which may be arranged in order to appropriately partition a memory.

Figure 6:
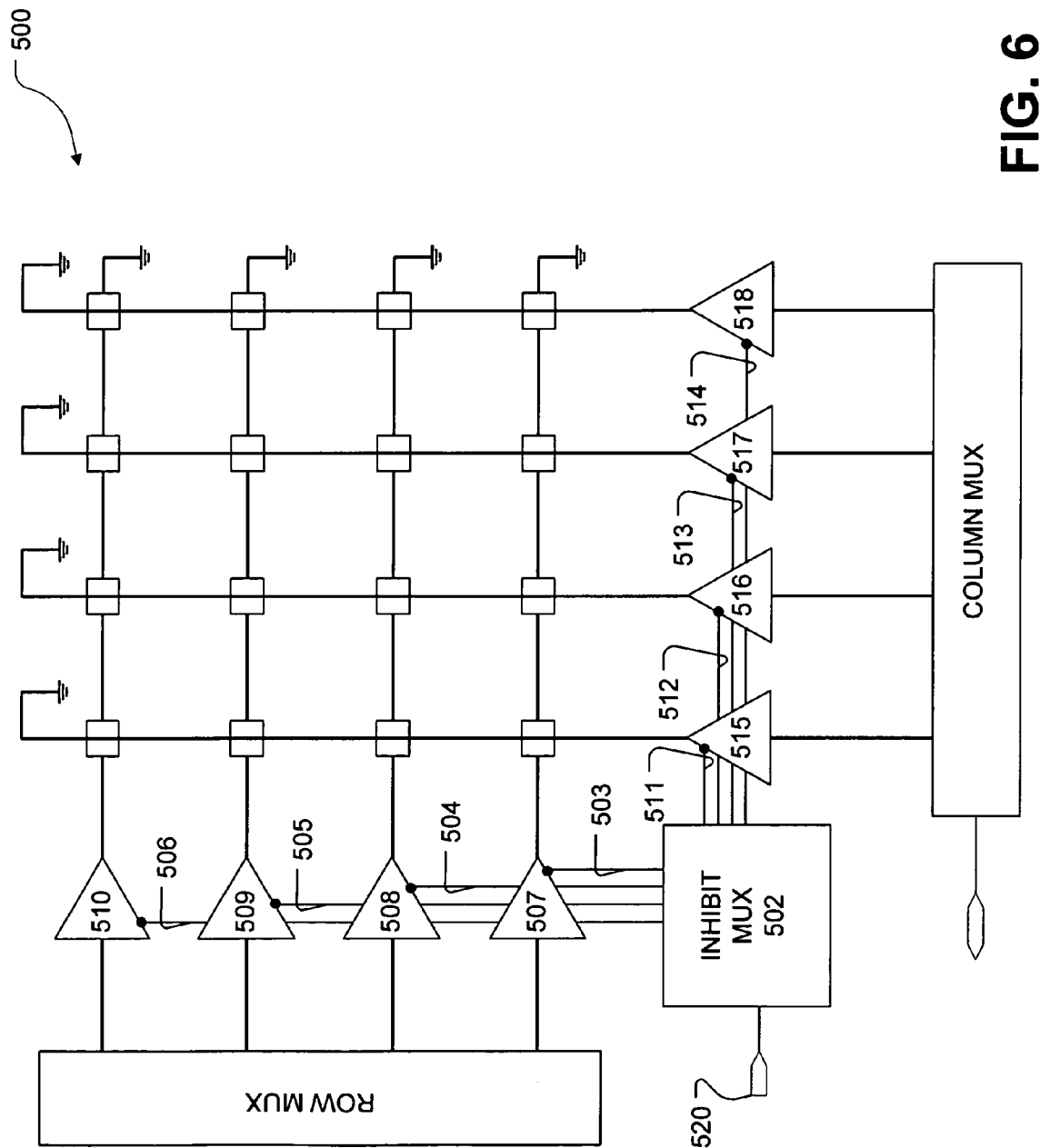
FIG. 6 is yet another block diagram of a memory comprising memory cells that may be partitioned.

In another example, write inhibit logic may be used to partition a memory. FIG. 6 shows an example memory 500 that includes a write inhibit multiplexer 502. The write inhibit mux 502 includes row select outputs coupled to data lines 503-506, which are respectively coupled to row current drivers 507-510. The write inhibit mux 502 also include column select outputs coupled to data lines 511-514, which are respectively coupled to column current drivers 515-518. To determine which memory cells within the memory 500 should be partitioned as random access or read only, the write inhibit mux 502 includes an input 520, which, for example, may be a multi-bit input. The multi-bit input may determine a size of the first and the second partitions. For example, the first bits of the input 520 may specify rows of the memory 500 that are to have current drivers inhibited. The remaining bits of the input 520 may specify columns that are to have current drivers inhibited. The overlap of the inhibited rows and columns may then serve as a read only partition of the memory 500. Other types of input signaling for the input 520 are also possible.

Figure 7A:
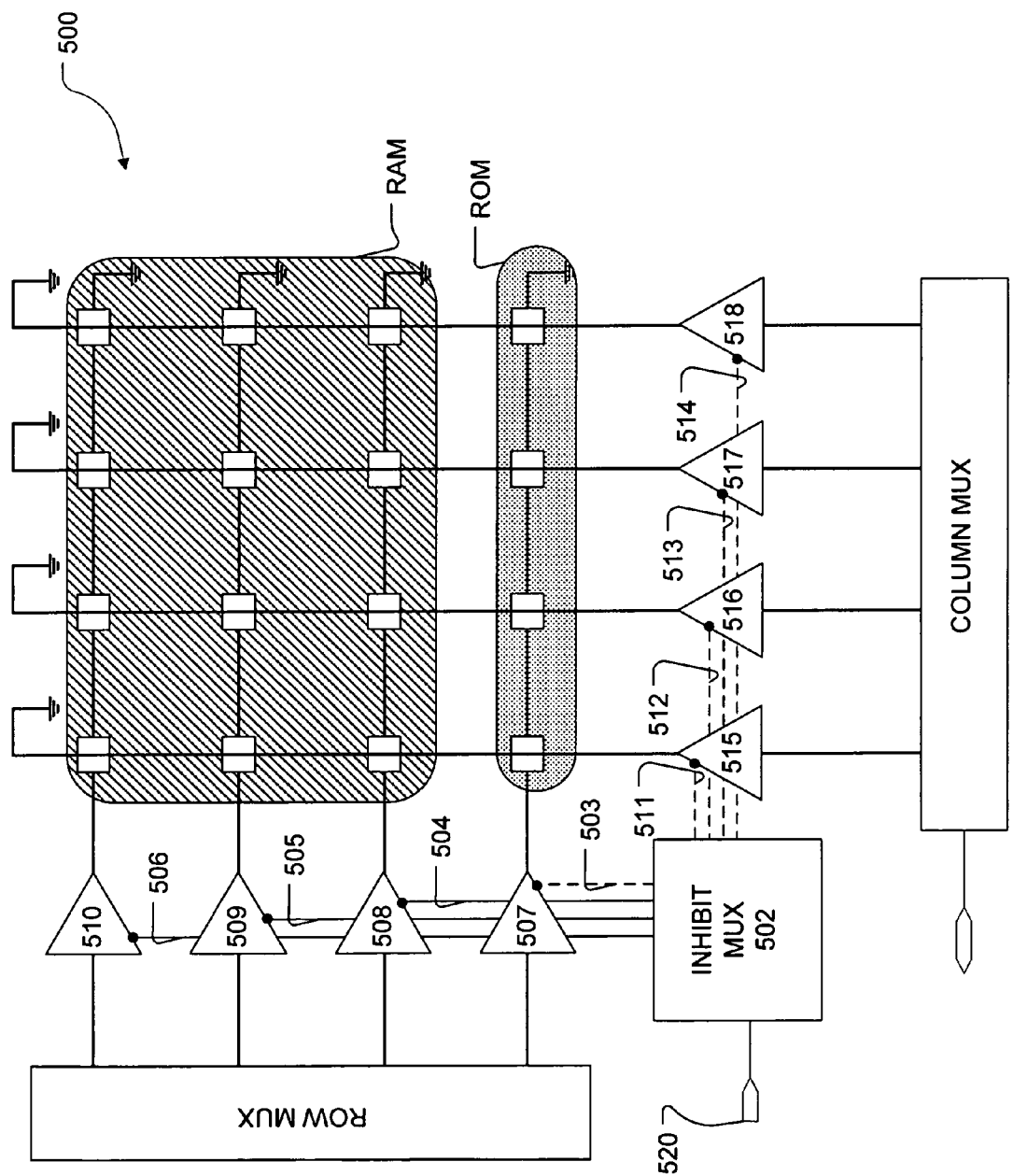
FIGS. 7A-C are block diagrams of various partitioning configurations of the memory of FIG. 6.
Figure 7B:
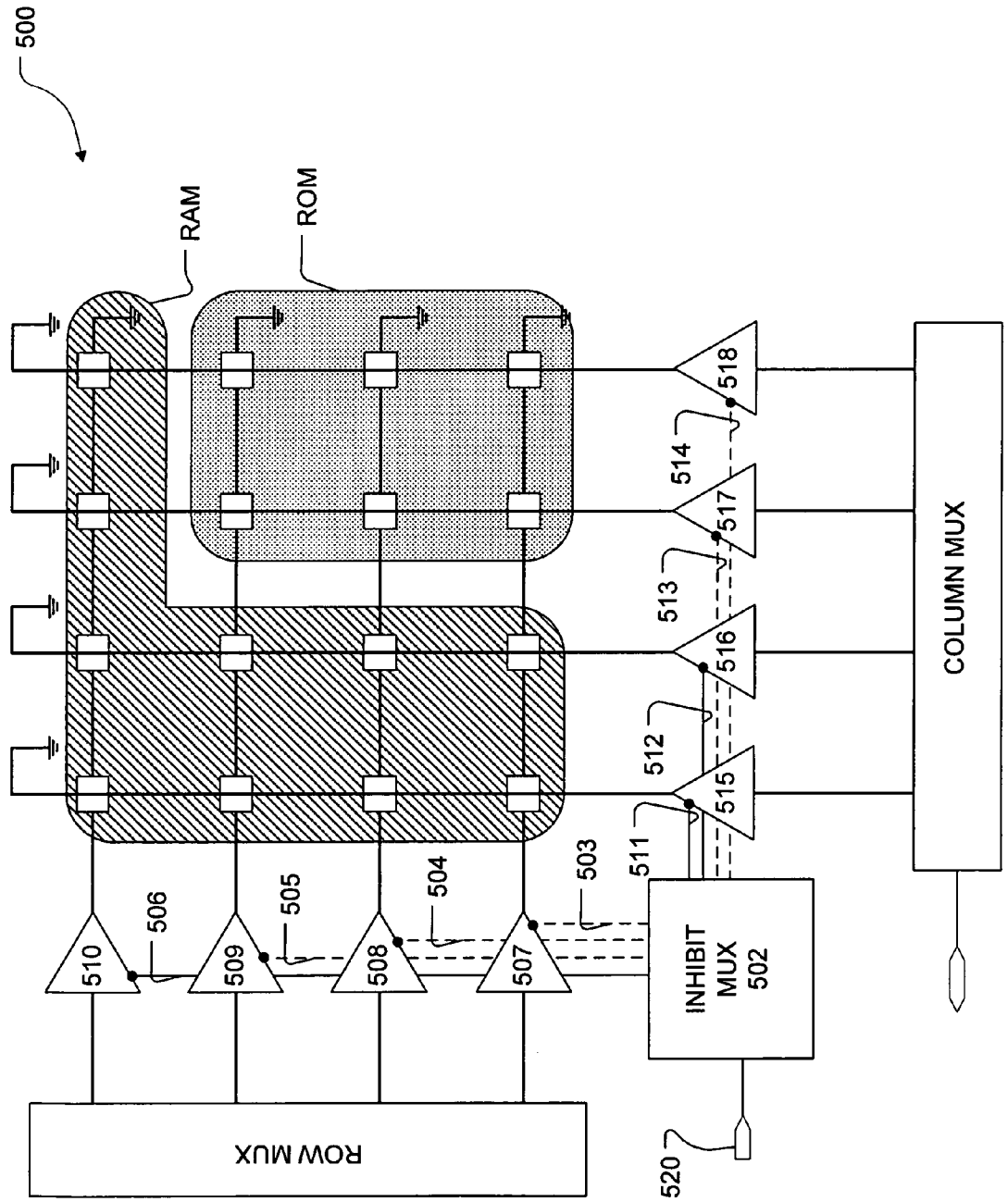
Figure 7C:
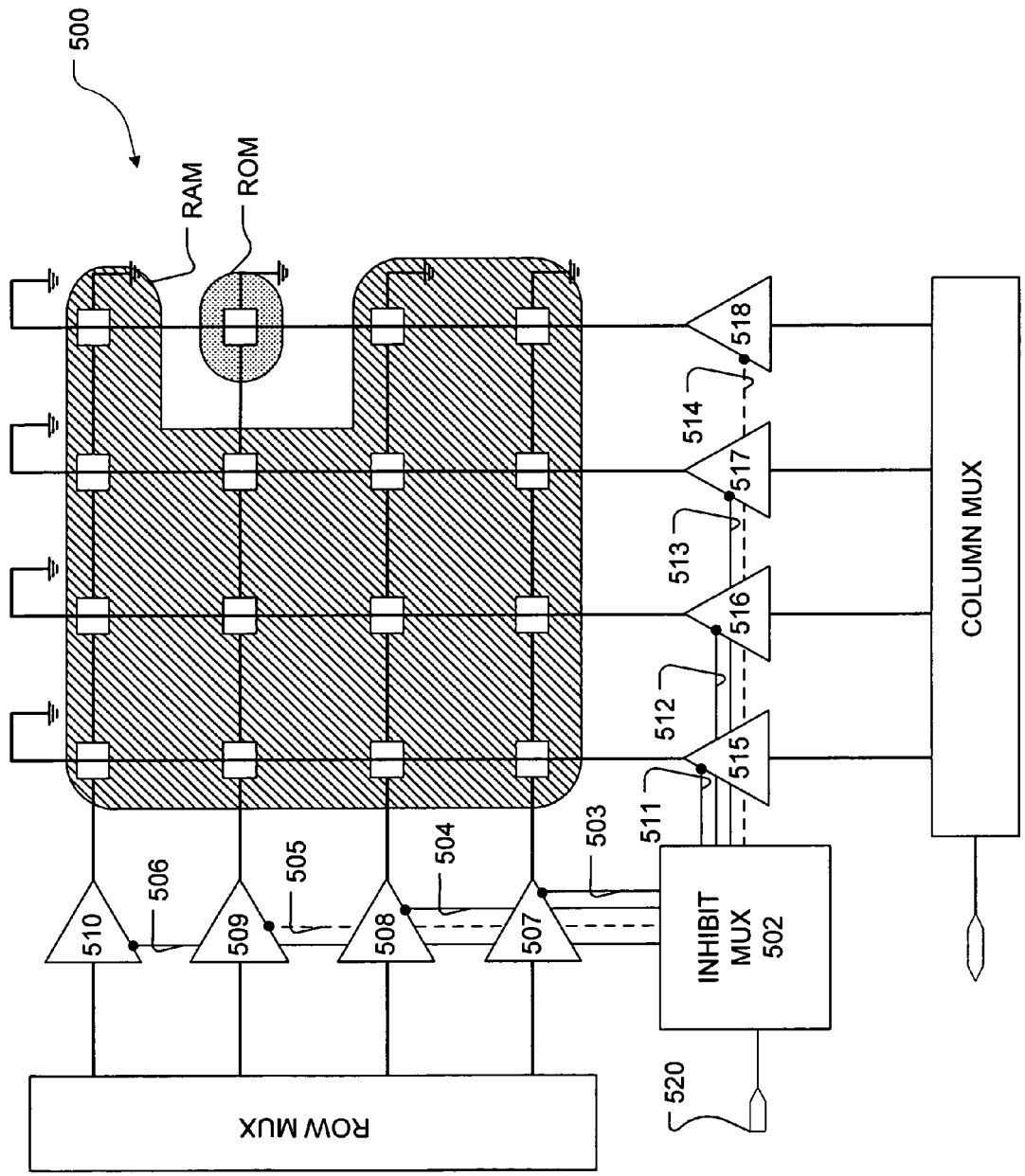

FIGS. 7A-C show various partitioning schemes of the memory 500. In FIG. 7A, the memory 500 is partitioned into 12 random access memory cells and 4 read only memory cells. The inhibit lines 503 and 511-514 each carry the inhibit signal (shown as a dashed inhibit line). In FIG. 7B, the memory 500 is partitioned into 10 random access memory cells and 6 read only memory cells. In the example of FIG. 7B, the inhibit lines 513, 514, and 503-505 each carry the inhibit signal. In FIG. 7C, the memory 500 is partitioned into 15 random access memory cells and 1 read only memory cell. In the example of FIG. 7C, the inhibit lines 505 and 514 each carry the inhibit signal.

It should be understood that a variety of other write inhibit logic configurations are possible. In addition, the write inhibit logic may also be employed in combination with partitioning circuitry. The write inhibit logic may use a variety of logic gates, multiplexers, comparators, or other logical schemes, which allow a memory to be selectively partitioned.

e) CONCLUSION

A variety of examples have been described above. More generally, those skilled in the art will understand that changes and modifications may be made to these examples without departing from the true scope and spirit of the present invention, which is defined by the claims. Thus, for example, the memory should not be limited to the type of bit that a memory cell comprises. Moreover, the illustrated memories are comprised of sixteen memory cells; however, memories with a greater number of memory cells may benefit from partitioning. These illustrations contain a reduced number of cells in order to generally convey the structure and method of partitioning a memory. The memory cells may also be grouped into memory words, where a set of bit lines provides reading and writing access to a particular memory word. In addition, although magnetic based memories are illustrated, it is contemplated that other non-volatile memories may also benefit from the partitioning described herein. Finally, device design, processing, and test conditions all affect magnetization switching characteristics and are therefore should be considered.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

I claim:

1. A memory, comprising:
    enable circuitry, configured to direct the memory to perform a write or a read;
    a first memory cell comprising a first magnetoresistive bit;
    a first current driver coupled to the first memory cell and configured to output a current, wherein the first current driver includes an operational mode input indicating a read-only mode for receiving a signal that inhibits the first current driver from outputting the current even while the first current driver is directed to perform a write by the enable circuitry to the first memory cell; and
    at least one read line, configured to read the first memory cell by carrying a read current, wherein the read current flows through the first magnetoresistive bit when the operational mode indicates a read-only mode.

2. The memory as in claim 1, wherein the first current driver is configured to output a current for generating a magnetic field in the first memory cell.

3. The memory as in claim 2, wherein the first memory cell is further coupled to a second current driver.

4. The memory as in claim 1, wherein the first magnetoresistive bit is a magnetic tunneling junction based device.

5. The memory as in claim 1, further comprising:
    a second memory cell comprising a second magnetoresistive bit; and
    a third current driver coupled to the second memory cell, wherein the third current driver includes an operational mode input for receiving a signal that inhibits the third current driver.

6. The memory as in claim 5, wherein the first and second memory cells are located on one chip.

7. The memory as in claim 6, wherein the third current driver is not inhibited so that the second memory cell is in a random access mode.

8. The memory as in claim 5, further comprising write inhibit logic coupled to the input of the first current driver and the input of the third current driver, wherein the write inhibit logic is configured to receive an input establishing an operating mode of the first memory cell and an operating mode of the second memory cell.

9. The memory as in claim 8, wherein the operating mode of the first memory cell and the operating mode of the second memory cell are selected from the group consisting of a read only mode, a programmable read only mode, and a random access mode.

10. A memory, comprising:
a plurality of memory cells, arranged into a plurality of row arrays and a plurality of column arrays, each memory cell including a magnetoresistive bit;
a plurality of row current drivers, wherein each row array in the plurality of row arrays is coupled to at least one row current driver;
a plurality of column current drivers, wherein each column array in the plurality of column arrays is coupled to at least one column current driver;
at least one read line, configured to read at least one memory cell of the plurality of memory cells at least when an operational mode is in a read-only mode; and
write inhibit logic, comprising a plurality of row select outputs and a plurality of column select outputs, wherein each row current driver is coupled to at least one row select output, wherein each row select output is operable to inhibit or not inhibit a row current driver coupled to the row select output, wherein each column driver is coupled to at least one column select output, wherein each column select output is operable to inhibit or not inhibit a column current driver coupled to the column select output, wherein the write inhibit logic is configured to:
determine that a write is to be performed to a first memory cell in the plurality of memory cells at least when the operational mode is not in the read-only mode, and responsively not inhibit both a row current driver and a column current driver associated with the first memory cell, and
determine that the write to the first memory cell is completed, and responsively inhibit both the row current driver and the column current driver associated with the first memory cell.

11. The memory as in claim 10, wherein the write inhibit logic permits selective partitioning of the plurality of memory cells.

12. The memory as in claim 11, wherein each memory cell from a second portion of the plurality of memory cells is configured to be written by a current driver coupled to the memory cell.

13. The memory as in claim 10, wherein a first portion of the plurality of memory cells has more memory cells than a second portion of the plurality of memory cells.

14. The memory as in claim 10, wherein the write inhibit logic comprises a multiplexer including a multi-bit input, a column select output, and a row select output, wherein the multi-bit input is for determining a size of a first portion of the plurality of memory cells and a second portion of the plurality of memory cells.

15. The method as in claim 10, further comprising:
partitioning the plurality of memory cells so that an operational mode of a first partition of the memory is a programmable-read-only mode and an operational mode of a second partition is a random-access mode.

16. A method of operating a memory comprising a plurality of memory cells, each memory cell comprising a magnetoresistive bit, the method comprising:
coupling a first memory cell in the plurality of memory cells to a first current driver and a second current driver, both the first current driver and the second current driver configured to be either inhibited or not inhibited;
determining an operational mode of the first memory cell;
allowing a read of the first memory cell when the operational mode is a read-only mode, a programmable-read-only mode, or a random-access mode;
preventing a write to the first memory cell when the operational mode is the read-only mode by inhibiting both the first current driver and the second current driver;
allowing a write to the first memory cell when the operational mode is the random-access mode by not inhibiting the first current driver or by not inhibiting the second current driver;
allowing the write to the first memory cell on a limited basis when the operational mode is the programmable-read-only mode by not inhibiting the first current driver and the second current driver for the limited basis and inhibiting the first current driver and the second current driver outside of the limited basis; and
responsive to determining the write of the first memory cell has completed, inhibiting both the first current driver and the second current driver.

17. The method as in claim 16, wherein inhibiting the first current driver comprises receiving a signal at the first current driver indicating the first memory cell is in a read only mode.

18. The method as in claim 17, wherein allowing a write to the first memory cell comprises not inhibiting the first current driver and using an output current from the first current driver to write the first memory cell.

19. The method as in claim 17, further comprising changing the first memory cell when the operational mode is the random-access mode by not inhibiting the first current driver.

20. The method as in claim 16, further comprising:
coupling a second memory cell in the plurality of memory cells to a third current driver, wherein the third current driver is configured to be either inhibited or not inhibited; and
allowing a write to the second memory cell by not inhibiting the third current driver, wherein the operational mode of the first memory cell is a read-only mode and an operational mode of the second memory cell is in a random-access mode.

* * * * *